(12) United States Patent
Loechelt

(10) Patent No.: US 8,519,474 B2
(45) Date of Patent: Aug. 27, 2013

(54) ELECTRONIC DEVICE INCLUDING AN INSULATING LAYER HAVING DIFFERENT THICKNESSES AND A CONDUCTIVE ELECTRODE AND A PROCESS OF FORMING THE SAME

(75) Inventor: Gary H. Loechelt, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 99 days.

(21) Appl. No.: 13/156,162

(22) Filed: Jun. 8, 2011

(65) Prior Publication Data

US 2011/0233658 A1   Sep. 29, 2011

Related U.S. Application Data

(63) Continuation of application No. 12/337,306, filed on Dec. 17, 2008, now Pat. No. 7,989,857.

(51) Int. Cl.
*H01L 29/66* (2006.01)

(52) U.S. Cl.
USPC ............. 257/329; 257/E29.241; 257/E21.19; 438/197

(58) Field of Classification Search
CPC ............ H01L 29/7813; H01L 29/7802; H01L 29/7827; H01L 29/785; H01L 29/517
USPC .................. 257/329, 288, E29.241, E21.19; 438/142, 197, 585
See application file for complete search history.

(56) References Cited

U.S. PATENT DOCUMENTS

| | | | |
|---|---|---|---|
| 7,126,193 B2 | 10/2006 | Baiocchi et al. | |
| 7,176,524 B2 | 2/2007 | Loechelt et al. | |
| 7,235,845 B2 | 6/2007 | Xu et al. | |
| 7,253,477 B2 | 8/2007 | Loechelt et al. | |
| 7,276,747 B2 | 10/2007 | Loechelt et al. | |
| 7,282,765 B2 | 10/2007 | Xu et al. | |
| 7,285,823 B2 | 10/2007 | Loechelt et al. | |
| 7,397,084 B2 | 7/2008 | Loechelt et al. | |
| 7,411,266 B2 | 8/2008 | Tu et al. | |
| 7,446,354 B2 | 11/2008 | Loechelt et al. | |
| 7,482,220 B2 | 1/2009 | Loechelt et al. | |
| 7,679,146 B2 | 3/2010 | Tu et al. | |
| 7,868,379 B2 | 1/2011 | Loechelt | |
| 2005/0110065 A1 | 5/2005 | Uchiyama et al. | |
| 2006/0180947 A1 | 8/2006 | Loechelt et al. | |

(Continued)

OTHER PUBLICATIONS

Notice of Allowance mailed Sep. 3, 2010 in Related U.S. Appl. No. 12/337,234.

(Continued)

*Primary Examiner* — A. Sefer
*Assistant Examiner* — Nikolay Yushin

(57) ABSTRACT

An electronic device includes a transistor, wherein the electronic device can include a semiconductor layer having a primary surface, a channel region, a gate electrode, a source region, a conductive electrode, and an insulating layer lying between the primary surface of the semiconductor layer and the conductive electrode. The insulating layer has a first region and a second region, wherein the first region is thinner than the second region. The channel region, gate electrode, source region, or any combination thereof can lie closer to the first region than the second region. The thinner portion can allow for faster switch of the transistor, and the thicker portion can allow a relatively large voltage difference to be placed across the insulating layer. Alternative shapes for the transitions between the different regions of the insulating layer and exemplary methods to achieve such shapes are also described.

19 Claims, 11 Drawing Sheets

(56) References Cited

U.S. PATENT DOCUMENTS

| | | |
|---|---|---|
| 2006/0226451 A1 | 10/2006 | Davies |
| 2006/0226498 A1 | 10/2006 | Davies |
| 2007/0034947 A1 | 2/2007 | Loechelt et al. |
| 2007/0057289 A1 | 3/2007 | Davies |
| 2007/0215914 A1 | 9/2007 | Loechelt |
| 2008/0265313 A1 | 10/2008 | Loechelt et al. |
| 2009/0014814 A1 | 1/2009 | Loechelt et al. |
| 2009/0096021 A1 | 4/2009 | Loechelt et al. |

OTHER PUBLICATIONS

Office Action mailed Apr. 2, 2010 in Related U.S. Appl. No. 12/337,234.

Notice of Allowance mailed Sep. 3, 2010 in Related U.S. Appl. No. 12/337,271.

N-Channel CICLON NexFET Power MOSFETs CSD16404Q5A Data Sheet, CICLON Semiconductor Device Corp., rev 2.7, 8 pages (2008).

N-Channel CICLON NexFET Power MOSFETs CSD16410Q5A Data Sheet, CICLON Semiconductor Device Corp., rev 1.0, 2 pages (2007).

Office Action mailed Apr. 1, 2010 in Related U.S. Appl. No. 12/337,271.

Declaration Under 37 C.F.R. § 1.132 of Gary H. Loechelt, signed Jun. 15, 2010. 7 pgs.

Notice of Allowance mailed Mar. 10, 2011 in Related U.S. Appl. No. 12/337,306.

Office Action mailed Jan. 7, 2011 in Related U.S. Appl. No. 12/958,002.

Office Action mailed Oct. 26, 2011 in Related U.S. Appl. No. 12/337,306.

ELECTRONIC DEVICE INCLUDING AN INSULATING LAYER HAVING DIFFERENT THICKNESSES AND A CONDUCTIVE ELECTRODE AND A PROCESS OF FORMING THE SAME

RELATED APPLICATION

This application is a continuation of and claims priority under 35 U.S.C. §120 to U.S. patent application Ser. No. 12/337,306 entitled "Electronic Device Including an Insulating Layer Having Different Thicknesses and a Conductive Electrode and a Process of Forming the Same" by Loechelt filed Dec. 17, 2008 now U.S. Pat. No. 7,989,857, which is assigned to the current assignee hereof and incorporated herein by reference in its entirety.

FIELD OF THE DISCLOSURE

The present disclosure relates to electronic devices and processes of forming electronic devices, and more particularly to, electronic devices including insulating layers having different thicknesses and conductive electrodes and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of a MOSFET, a designer is often faced with trade-offs in device parameter performance. Specifically, available device structure or fabrication process choices may improve one device parameter, but at the same time such choices may degrade one or more other device parameters. For example, available structures and processes that improve on resistance ($R_{DSON}$) of a MOSFET may reduce the breakdown voltage ($BV_{DSS}$) and increase parasitic capacitance between regions within the MOSFET.

BRIEF DESCRIPTION OF THE DRAWINGS

Embodiments are illustrated by way of example and are not limited in the accompanying figures.

Figure 1:
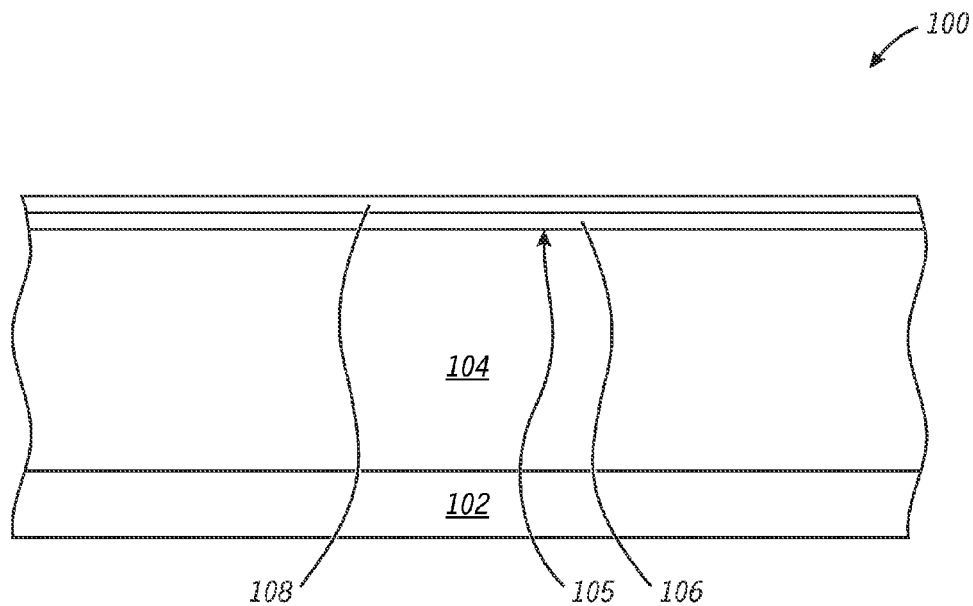
FIG. 1 includes an illustration of a cross-sectional view of a portion of a workpiece that includes an underlying doped region, a semiconductor layer, a pad layer, and a stopping layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the CRC Handbook of Chemistry and Physics, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

FIG. 1 includes an illustration of a cross-sectional view of a portion of a workpiece 100. The workpiece 100 includes an underlying doped region 102 that is lightly doped or heavily doped, n-type or p-type. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. The underlying doped region 102 can be a portion of a heavily doped substrate (e.g., a heavily n-type doped wafer) or may be a buried doped region overlying a substrate of opposite conductivity type or overlying a buried insulating layer (not illustrated) that lies between a substrate and the buried doped region. In a particular embodiment, the underlying doped region 102 can include a lightly doped portion overlying a heavily doped portion, for example when an overlying semiconductor layer 104 has an opposite conductivity type, to help increase the junction breakdown voltage. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low, and in a particular embodiment, the underlying doped region 102 includes antimony to reduce the level of outgassing (as compared to arsenic) during formation of the semiconductor layer 104.

In the embodiment illustrated in FIG. 1, the semiconductor layer 104 overlies the underlying doped region 102. The semiconductor layer 104 has a primary surface 105. The semiconductor layer 104 can include a Group 14 element (i.e., carbon, silicon, germanium, or any combination thereof) and any of the dopants as described with respect to the underlying doped region 102 or dopants of the opposite conductivity type. In an embodiment, the semiconductor layer 104 is a lightly doped n-type or p-type epitaxial silicon layer having a thickness in a range of approximately 0.5 microns to approximately 5.0 microns, and a doping concentration no greater than approximately $10^{16}$ atoms/cm$^3$, and in another embodiment, a doping concentration of least approximately $10^{14}$ atoms/cm$^3$.

A pad layer 106 and a stopping layer 108 (e.g., a polish-stop layer or an etch-stop layer) are formed over the semiconductor layer 104 using a thermal growth technique, a deposition technique, or a combination thereof. Each of the pad layer 106 and the stopping layer 108 can include an oxide, a nitride, an oxynitride, or any combination thereof. In an embodiment, the pad layer 106 has a different composition as compared to the stopping layer 108. In a particular embodiment, the pad layer 106 includes an oxide, and the stopping layer 108 includes a nitride.

Figure 2:
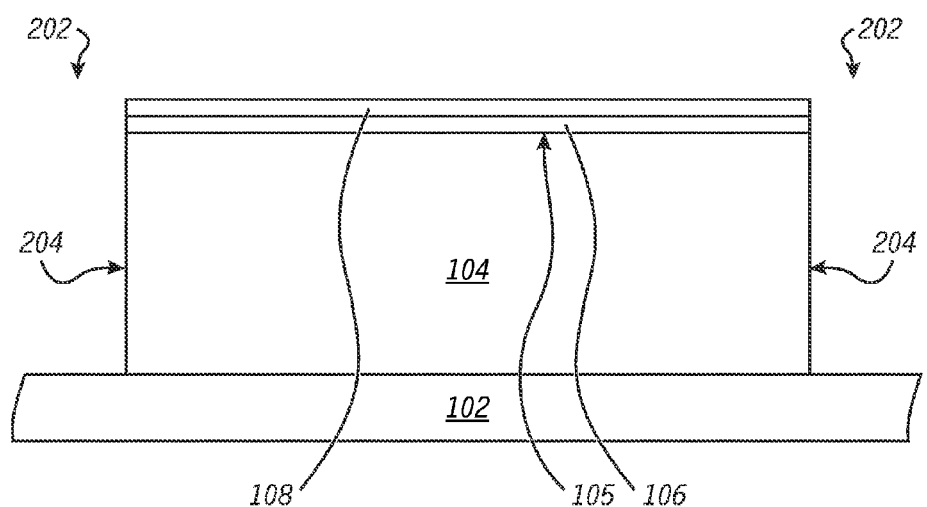
FIG. 2 includes an illustration of a cross-sectional view of the workpiece of FIG. 1 after forming a trench extending through a semiconductor layer to the underlying doped region.

Referring to FIG. 2, portions of the semiconductor layer 104, pad layer 106, and stopping layer 108 are removed to form trenches, such as trench 202, that extend from the primary surface 105 of the semiconductor layer 106 toward the underlying doped region 102. The trench 202 may be a single trench with different parts illustrated in FIG. 2, or the trench 202 can include a plurality of different trenches. The width of the trench 202 is not so wide that a subsequently-formed conductive layer is incapable of filling the trench 202. In a particular embodiment, the width of each trench 202 is at least approximately 0.3 micron or approximately 0.5 micron, and in another particular embodiment, the width of each trench 202 is no greater than approximately 4 microns or approximately 2 microns. After reading this specification, skilled artisans will appreciate that narrower or wider widths outside the particular dimensions described may be used. The trenches 202 can extend to the underlying doped region 102; however, the trenches 202 may be shallower if needed or desired.

The trenches are formed using an anisotropic etch. In an embodiment, a timed etch can be performed, and in another embodiment, a combination of endpoint detection (e.g., detecting the dopant species from the underlying doped region 102, such as arsenic or antimony) and a timed overetch may be used.

If needed or desired, a dopant can be introduced into a portion of the semiconductor layer 104 along a sidewall 204 of the trench 202 to form a sidewall doped region (not illustrated in FIG. 2) that is heavily doped. A tilt angle implant technique, a dopant gas, or a solid doping source may be used.

Figure 3:
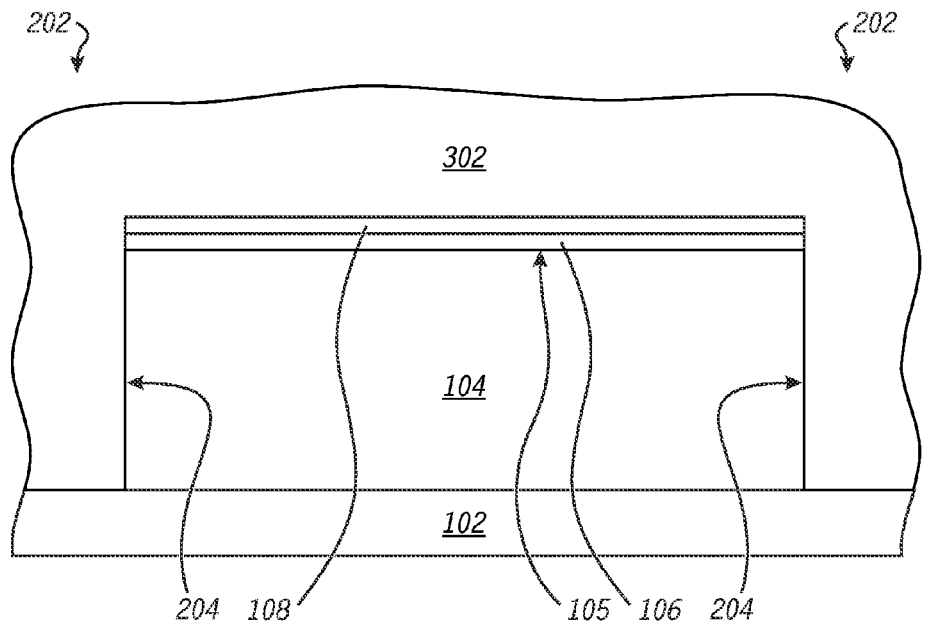
FIG. 3 includes an illustration of a cross-sectional view of the workpiece of FIG. 2 after forming a conductive layer that substantially fills the trench.

A conductive layer 302 is formed over the stopping layer 108 and within the trench 202, as illustrated in FIG. 3. The conductive layer 302 substantially fills the trench 202. The conductive layer 302 can include a metal-containing or semiconductor-containing material. In an embodiment, the conductive layer 302 can include a heavily doped semiconductor material, such as amorphous silicon or polysilicon. In another embodiment, the conductive layer 302 includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. In a more particular embodiment, the conductive layer 302 can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer 302 to meet their needs or desires for a particular application.

Figure 4:
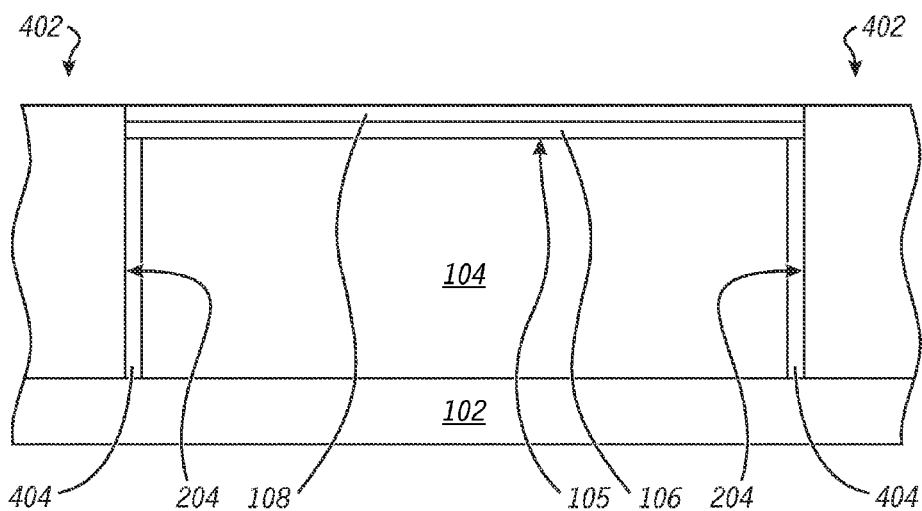
FIG. 4 includes an illustration of a cross-sectional view of the workpiece of FIG. 3 after removing a portion of the conductive layer lying outside the trench, and after forming a sidewall doped region.

A portion of the conductive layer 302 that overlies the stopping layer 108 is removed to form conductive structures within the trenches, such as conductive structure 402 within the trench 202, as illustrated in the embodiment of FIG. 4. The removal can be performed using a chemical-mechanical polishing or blanket etching technique. The stopping layer 108 may be used as a polish-stop or etch-stop layer. Polishing or etching may be continued for a relatively short time after the stopping layer 108 is reached to account for a non-uniformity across the workpiece with respect to the thickness of the conductive layer 302, the polishing or etching operation, or any combination thereof.

Before, during, or after formation of the conductive structures, sidewall doped regions, such as sidewall doped region 404, can be formed from portions of the semiconductor layer 104 and extend from the sidewall 204. The dopant may be introduced during a doping operation previously described and become activated when the conductive layer 302 is formed. Alternatively, when the conductive layer 302 includes a doped semiconductor material, the dopant may diffuse from the conductive structure 402 or from the conductive layer 302 (before formation of the conductive structure 402 is completed).

Figure 5:
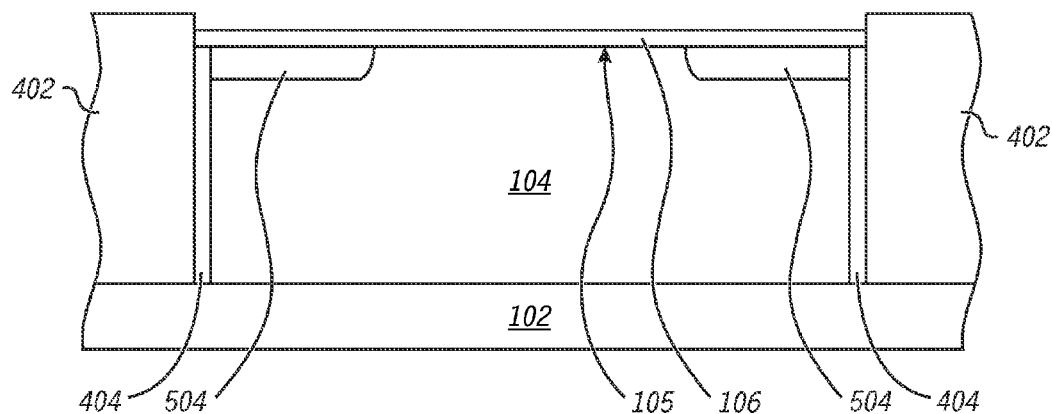
FIG. 5 includes an illustration of a cross-sectional view of the workpiece of FIG. 4 after removing the stopping layer.

In FIG. 5, the stopping layer 108 is removed, and portions of the semiconductor layer 104 lying immediately adjacent to the primary surface 105 and the sidewall doped regions, such as sidewall doped region 404, are doped to form surface doped regions, such as surface doped region 504, that are spaced apart from the underlying doped region 102. The surface doped region 504 has the same conductivity type as the sidewall doped region 404 and the underlying doped region 102. The surface doped region 504 has a depth in a range of approximately 0.1 micron to approximately 0.5 microns. The lateral dimension (from the conductive structure 402) can depend on the voltage difference between the source and drain of the power transistor being formed. As the voltage difference between the source and drain of the transistor increases, the lateral dimension can also increase. In an embodiment, the voltage difference is greater than approximately 20 V, and in another embodiment, the voltage difference is no greater than 30 V, 50 V, or more. The lateral dimension, which extends from the conductive structure 402, can be in a range of approximately 0.2 micron to approximately 3.0 microns. In a particular embodiment, the lateral dimension is in a range of approximately 0.5 micron to 2.0 micron. The peak doping concentration within the horizontally-oriented doped region can be in a range of approximately $2\times10^{17}$ atoms/cm$^3$ to approximately $2\times10^{18}$ atoms/cm$^3$, and in a particular embodiment, in a range of approximately $4\times10^{17}$ atoms/cm$^3$ to approximately $7\times10^{17}$ atoms/cm$^3$. The pad layer 106 remains over the semiconductor layer 104 after formation of the surface doped regions 504, or is removed after the surface doped regions 504 are formed.

Figure 6:
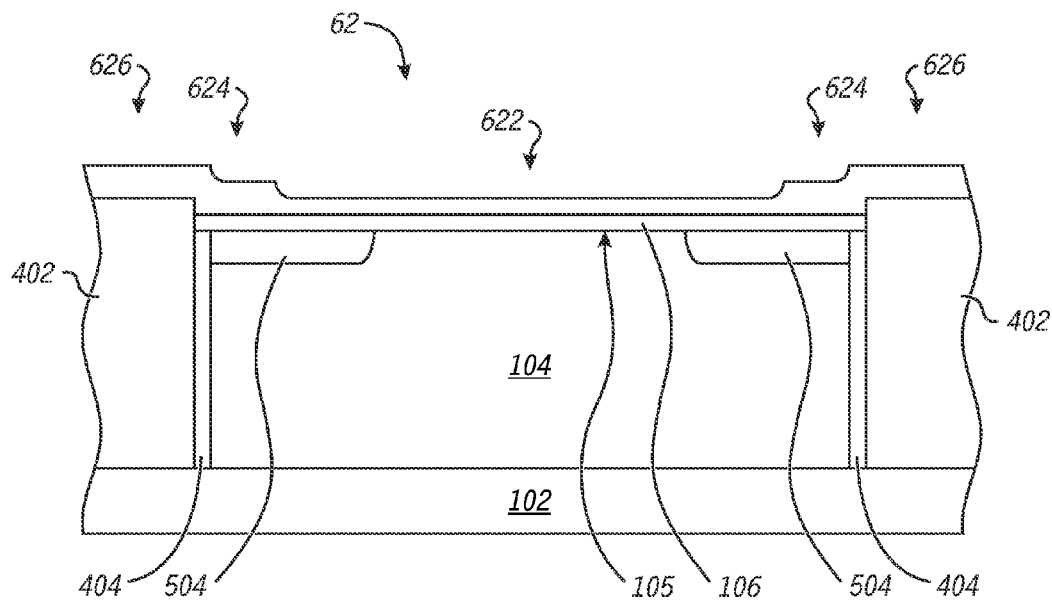
FIG. 6 includes an illustration of a cross-sectional view of the workpiece of FIG. 5 after forming an insulating layer having different regions.

An insulating layer 62 is formed over the conductive structure 402 and the pad layer 106 as illustrated in FIG. 6. The insulating layer 62 includes at least two different regions having different thicknesses. In effect, the insulating layer 62 has a terraced configuration, the significance of which is described later in this specification. In the embodiment as illustrated in FIG. 6, the insulating layer 62 includes regions 622, 624, and 626. The region 622 overlies the surface doped region 504 and will be closer to the subsequently-formed gate electrode, channel region, and source region. The thickness of the insulating layer 62 within the region 622 will be thinner than the thickness within the region 626. The thickness of the insulating layer 62 within the region 624 may be the same as the thickness within the region 622 or 626 or may have a thickness between that of the regions 622 and 626.

In an embodiment, the insulating layer 62 within the region 622 has a thickness of at least approximately 0.02 microns or at least approximately 0.05 microns, and in another embodiment, the insulating layer 62 within the region 622 has a thickness no greater than approximately 0.2 microns or no greater than approximately 0.1 microns. The region 624 overlies the surface doped region 504 and can be thicker than the region 622. In an embodiment, the insulating layer 62 within the region 624 has a thickness of at least approximately 0.05 microns or at least approximately 0.15 microns, and in another embodiment, the insulating layer 62 within the region 624 has a thickness no greater than approximately 0.5 microns or no greater than approximately 0.25 microns. The region 626 overlies the conductive structure 402 and is thicker than the region 622. The regions 624 and 626 may have the same thicknesses or a different thickness. In an embodiment, the insulating layer 62 within the region 626 has a thickness of at least approximately 0.15 microns or at least approximately 0.25 microns, and in another embodiment, the insulating layer 62 within the region 626 has a thickness no greater than approximately 0.8 microns or no greater than approximately 0.5 microns. In a particular embodiment, the insulating layer 62 within the region 622 has a thickness in a range of approximately 0.03 microns to approximately 0.08 microns, the insulating layer 62 within the region 624 has a thickness in a range of approximately 0.13 microns to approximately 0.2 microns, and the insulating layer 62 within the region 626 has a thickness in a range of approximately 0.3 microns to approximately 0.5 microns.

The insulating layer 62 can be formed by different techniques and achieve different shapes as seen from cross-sectional views. The insulating layer 62 can be formed from a single insulating film or a plurality of insulating films that are deposited over the workpiece. The single insulating film or the plurality of insulating films can include an oxide, a nitride, an oxynitride, or a combination thereof. In a particular embodiment, the characteristics of the insulating layer 62 may be different for points closer to the pad layer 106 and conductive structure 402 as compared to corresponding points further from the pad layer 106 and conductive structure 402, respectively. In an embodiment, the composition of the insulating layer 62 may change during or between depositions. For example, an oxide film may be closer to the doped region 504 and the conductive structure 402, and a nitride film may be deposited over the oxide film. In another embodiment, a dopant, such as phosphorus, can be incorporated at an increasing concentration during a later part of the deposition. In still another embodiment, the stress within the film can be changed by changing deposition parameters (e.g., radio frequency power, pressure, etc.) even though the composition is substantially the same throughout the thickness of the insulating layer 62. In further embodiments, combinations of the foregoing may be used.

FIGS. 7 to 10 include cross-sectional views of portions of workpieces to illustrate potential shapes of the transition between the regions of the insulating layer 62. The shapes in FIGS. 7 to 10 and the corresponding techniques illustrate only some exemplary, non-limiting shapes and techniques. After reading this specification, skilled artisans will appreciate that other shapes and techniques can be used without departing from the scope of the concepts described herein.

Figure 7A:
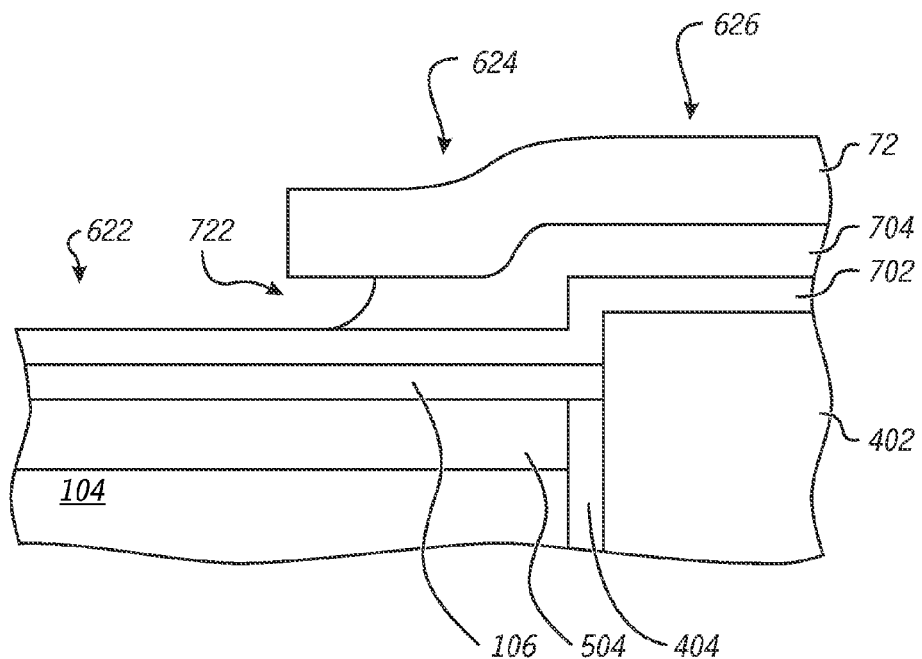
FIGS. 7A to 10 include illustrations of cross-sectional views of portions of the workpieces of FIG. 6 having different shapes at transitions between regions within the insulating layer in accordance with different embodiments.
Figure 7B:
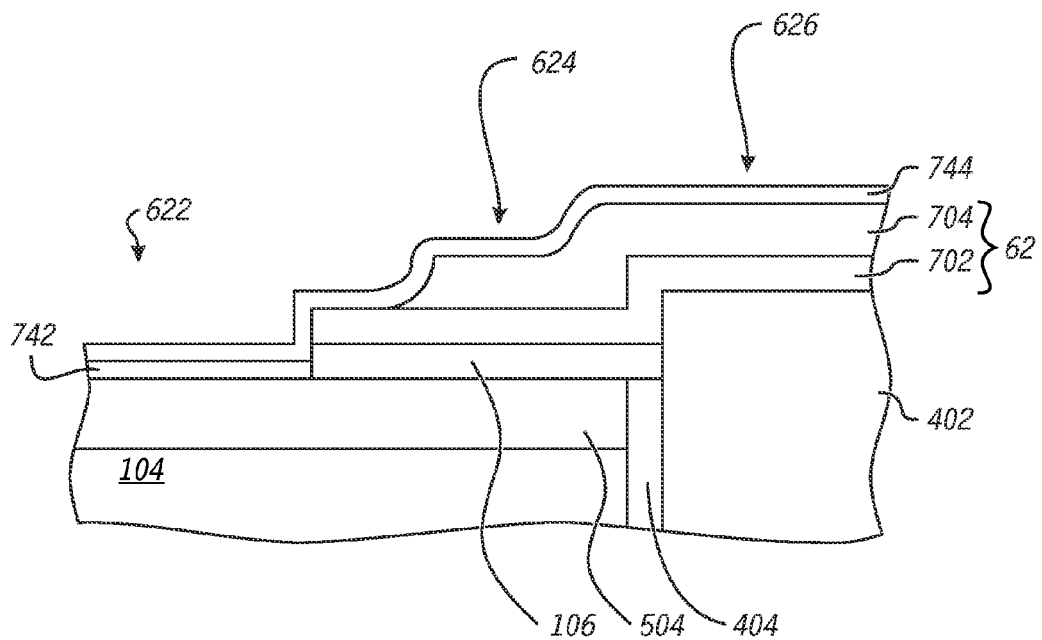

Referring to FIGS. 7A and 7B, the insulating layer 62 can include a plurality of insulating films that can allow for different thicknesses in the different regions. In the embodiment as illustrated in FIG. 7B, the pad layer 106 can include an oxide having a thickness in a range of approximately 50 nm to approximately 100 nm, and in a particular embodiment, in a range of approximately 60 nm to approximately 70 nm. A nitride film 702 and an oxide film 704 can be serially deposited over the pad layer 106 and the conductive structure 402. The nitride film 702 can have a thickness in a range of approximately 30 nm to approximately 70 nm, and the oxide film 704 can have a thickness in a range of approximately 0.2 microns to approximately 0.5 microns. In a particular embodiment, the oxide film 704 can be formed using tetraethylorthosilicate for sufficient step coverage.

After depositing the nitride and oxide films 702 and 704, a resist mask 72 can be formed and patterned to define an opening to expose a portion of the oxide film 704 corresponding to the region 622, as illustrated in FIG. 7A. The exposed portion of the oxide film 704 may be isotropically etched and undercut part of the resist mask 72 to remove the oxide film 704 from the region 624. In this particular embodiment, a transition 722 between the regions 624 and 626 has a concave shape. In a more particular embodiment, before the removal of resist mask 72, the remaining portion of insulating layer 62 in region 622 along with pad layer 106 can be partially or entirely removed by an anisotropic etch after the isotropic etch forming transition 722.

The resist mask 72 can then be removed as illustrated in FIG. 7B, an additional insulating material can be added to layer 62 using a thermal growth technique, a deposition technique, or a combination thereof. In a particular embodiment, an oxide film 742 can be thermally grown from silicon within the doped region 504 to a thickness in a range of approximately 20 nm to approximately 40 nm, and a nitride film 744 can be deposited over the oxide film 742, the nitride film 702, and the oxide film 704. The nitride film 744 can have a thickness as previously described with respect to the nitride film 702. The nitride films 702 and 744 can have the same thickness or different thicknesses. These additional process actions enable further shaping of the thickness of insulating layer 62 between regions 622 and 624. In this particular embodiment, the insulating layer 62, which includes the pad layer 106 and films 702, 704, 742, and 744, has different thicknesses within the regions 622, 624, and 626. More particularly, the insulating layer 62 within region 624 is closer to the thickness within the region 622 as compared to the region 626. In another embodiment (not illustrated), the transition can be a single step. In this particular embodiment, the oxide film can be anisotropically etched until part or all of the thickness of the oxide film is removed within the opening of the resist mask 72. After reading this specification, skilled artisans will appreciate that other embodiments can be used to achieve a terraced dielectric that can be tailored for a particular application.

Figure 8:
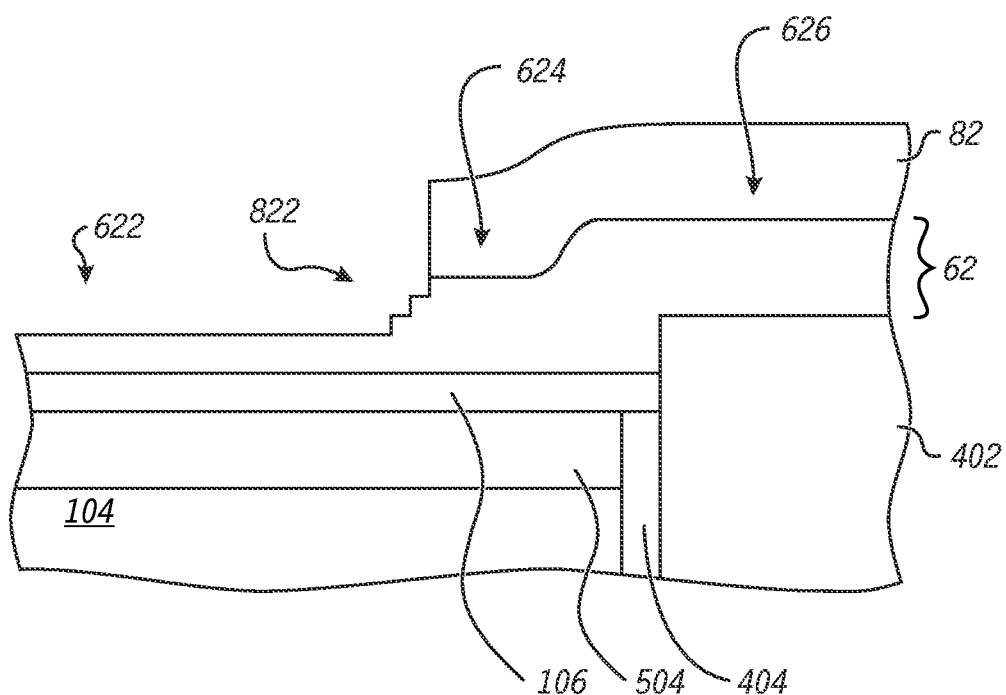
Figure 9:
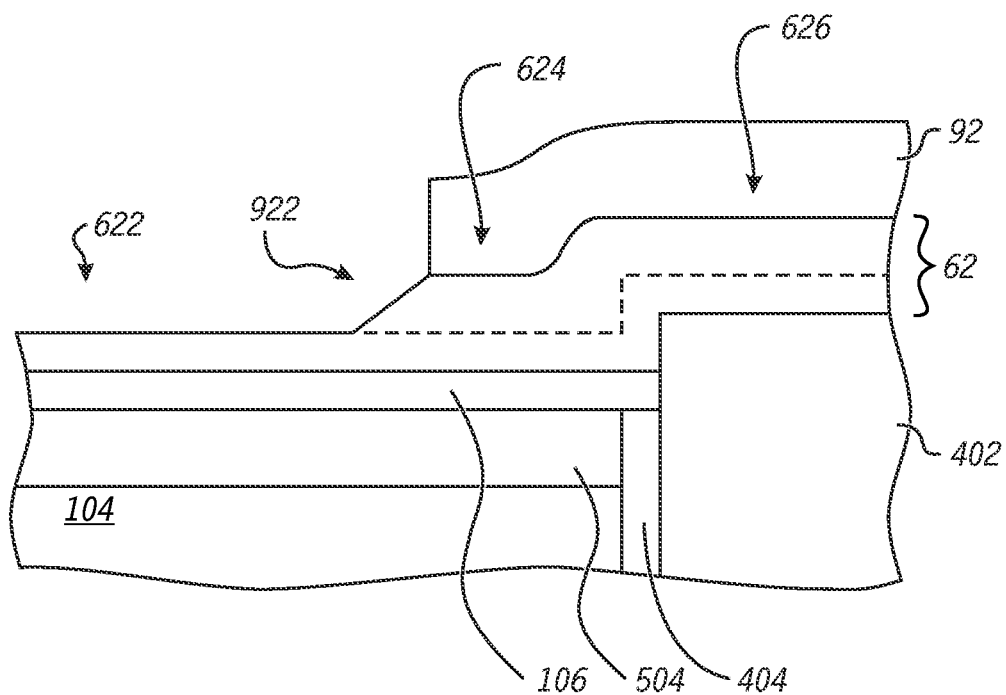
Figure 10:
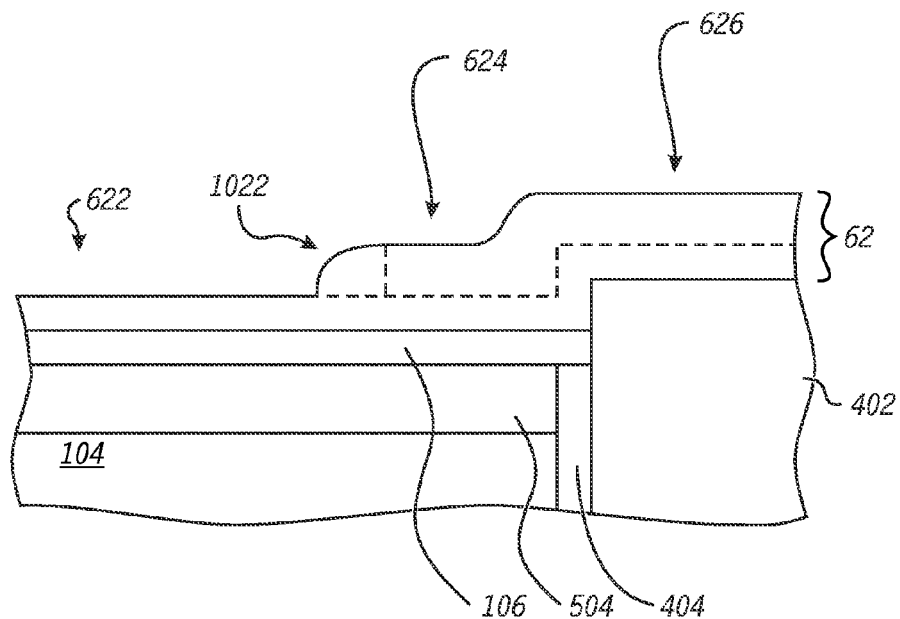

In the embodiments as illustrated in FIGS. 8 to 10, the thickness of the insulating layer within the regions 624 and 626 are substantially the same. In other embodiments (not illustrated), the insulating layer 62 can have a thickness within the region 624 that is different from both the regions 622 and 624.

FIG. 8 includes an illustration of the insulating layer 62 having a plurality of steps to produce a staircase-type structure at a transition 822 between the regions 622 and 624. A resist mask is formed and patterned to define an opening. The initial shape of the opening corresponds to the vertical surface of a transition 822 closest to the region 622. The insulating layer 62 is etched only partially through its thickness. The depth of the etching corresponds to the vertical surface closest to the region 622. The resist mask 82 is then isotropically etched to widen the opening. The process sequence continues with alternating an anisotropic etch of the insulating layer 62 and an isotropic etch of the resist mask 82 to achieve a profile of the transition 822 between the regions 622 and 624 as needed or desired. More or fewer steps in the transition 822 may be formed, and the ratio of the vertical and linear dimensions of the steps can be adjusted as needed or desired.

FIG. 9 includes an illustration of the insulating layer 62 having a linearly sloped surface at a transition 922 between the regions 622 and 624. A resist mask is formed and patterned to define an opening. The initial shape of the opening corresponds to the point where the transition 922 meets the horizontal portion of the insulating layer 62 that extends over the region 622. The insulating layer 62 and resist mask 92 can be etched simultaneously during at least one point in time. In the embodiment as illustrated in FIG. 9, the insulating layer 62 and resist mask 92 are etched during substantially all of the etch operation. The etch can be ended when a lower insulating film (illustrated by the dashed line) within the insulating layer 62 becomes exposed. In another embodiment (not illustrated), the resist mask 92 can be formed as initially described, wherein the opening corresponds to the point where the transition 922 meets the horizontal portion of the insulating layer 62. After anisotropically etching through part of the thickness of the insulating layer 62, an isotropic etchant is used that preferentially etches the portion of the insulating layer 62 at portions closer to the resist mask 92. For example, the insulating layer 62 can include a doping concentration that increases as the insulating layer 62 becomes thicker or the stress or other physical characteristic is changed by modifying the deposition conditions while the insulating layer 62 is being deposited. The use of the differential characteristics may cause other process complications; however, skilled artisans will understand the effect of the process complications and whether the risks they pose are acceptable or can be reduced or substantially eliminated.

FIG. 10 includes an illustration of the insulating layer 62 having parabolic shape at a transition 1022 between the regions 622 and 624. The transition 1022 between the regions 622 and 624 can be formed using conventional or proprietary sidewall spacer formation techniques.

FIGS. 7 to 10 include some examples of the shape of the transition between the regions 622 and 624, and other shapes are possible. For example, combinations of different techniques can form hybrids of the shapes described. The shapes can be tailored to produce transitions that allow acceptable electrical fields and step coverage (for a subsequently-formed conductive layer).

Figure 11:
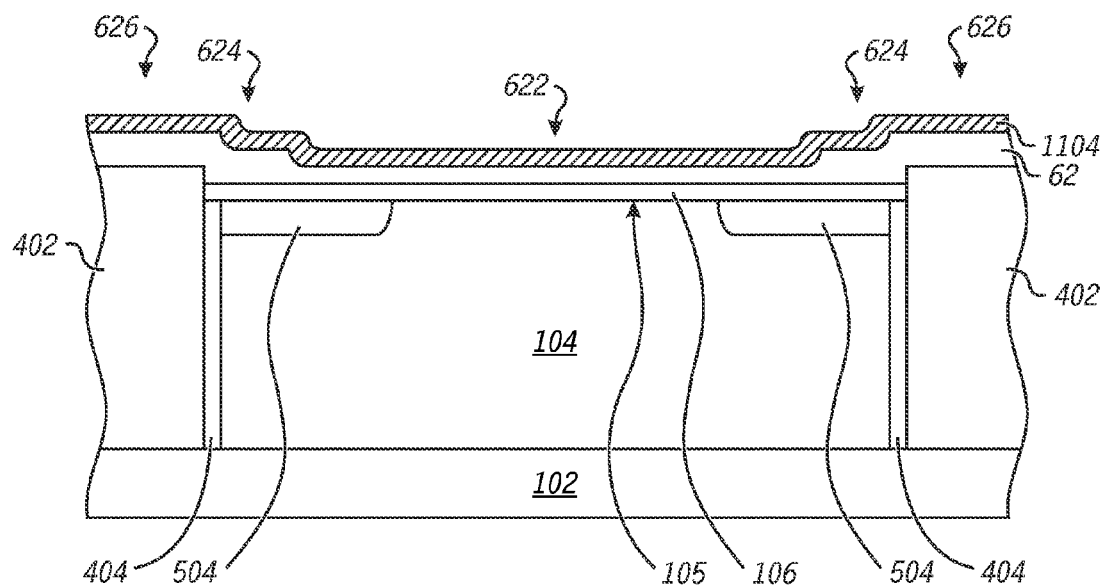
FIG. 11 includes an illustration of a cross-sectional view of the workpiece of FIG. 6 after forming a conductive layer over the insulating layer.

A conductive layer 1104 is formed by depositing a conductive material over the insulating layer 62, including the regions 622, 624, and 626, as illustrated in FIG. 11. The thicker portion of insulating layer 62 within the region 626 allows a higher voltage difference between the conductive layer 1104 and the conductive structure 402 before the insulating layer 62 has a dielectric breakdown. The thinner portion of insulating layer 62 within the region 622 helps to shield a subsequently-formed gate electrode. The conductive layer 1104 has a thickness in a range of approximately 0.05 micron to approximately 0.5 microns. The conductive layer 1104 includes a conductive material or may be made conductive, for example, by doping. The conductive layer 1104 can include a doped semiconductor material (e.g., heavily doped amorphous silicon, polysilicon, etc.), a metal-containing material (a refractory metal, a refractory metal nitride, a refractory metal silicide, etc.), or any combination thereof. In a particular embodiment, the conductive layer 1104 is a conductive electrode layer that will be used to form a conductive electrode. The conductive layer 1104 may be patterned at this time to define a conductive electrode or may be patterned at a later point in the process flow.

Figure 12:
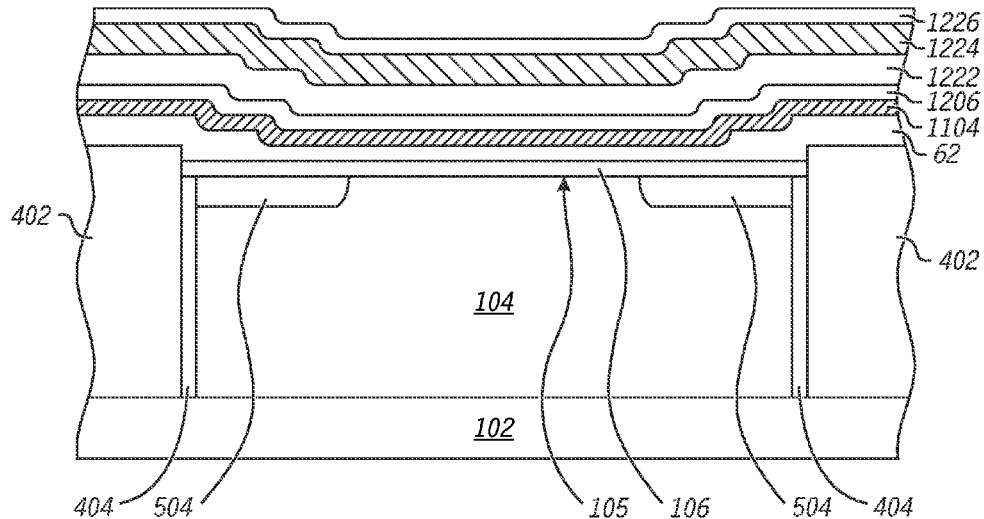
FIG. 12 includes an illustration of a cross-sectional view of the workpiece of FIG. 11 after forming a plurality of layers over the conductive layer.

A set of layers are formed over the conductive layer 1104 in FIG. 12. In an embodiment, an insulating layer 1206, an insulating layer 1222, a conductive layer 1224, and an insulating layer 1226 can be serially deposited. Each of the insulating layers 1206, 1222, and 1226 can include an oxide, a nitride, an oxynitride, or any combination thereof.

The conductive layer 1224 includes a conductive material or may be made conductive, for example, by doping. The conductive layer 1224 can include any of the materials and be formed using any of the techniques as described with respect to the conductive layer 1104. The conductive layers 1104 and 1224 can have the same composition or different compositions. The conductive layer 1224 can have a thickness in a range of approximately 0.1 micron to approximately 0.9 microns. In a particular embodiment, the conductive layer 1224 is a gate signal layer. The conductive layer 1224 may be patterned at this time to define a gate signal line or may be patterned at a later point in the process flow.

In another particular embodiment, the insulating layer 1206 includes a nitride having a thickness in a range of approximately 0.05 microns to approximately 0.2 microns. The insulating layers 1222 and 1226 include an oxide, the insulating layer 1222 can have a thickness in a range of approximately 0.2 microns to approximately 0.9 microns, and the insulating layer 1226 can have a thickness in a range of approximately 0.05 microns to approximately 0.2 microns. In still another particular embodiment, the insulating layer 1226 includes a nitride. An antireflective layer may be incorporated within any of the insulating or conductive layers or may be used separately (not illustrated). In another embodiment, more or fewer layers may be used, and thicknesses as described herein are merely illustrative and not meant to limit the scope of the present invention.

Figure 13:
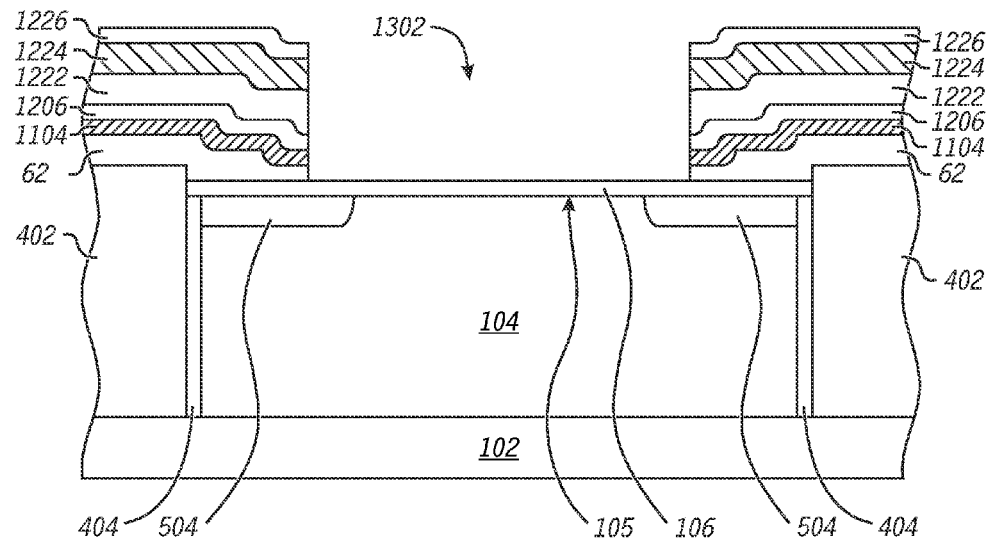
FIG. 13 includes an illustration of a cross-sectional view of the workpiece of FIG. 12 after forming an opening extending through the plurality of layers.
Figure 14:
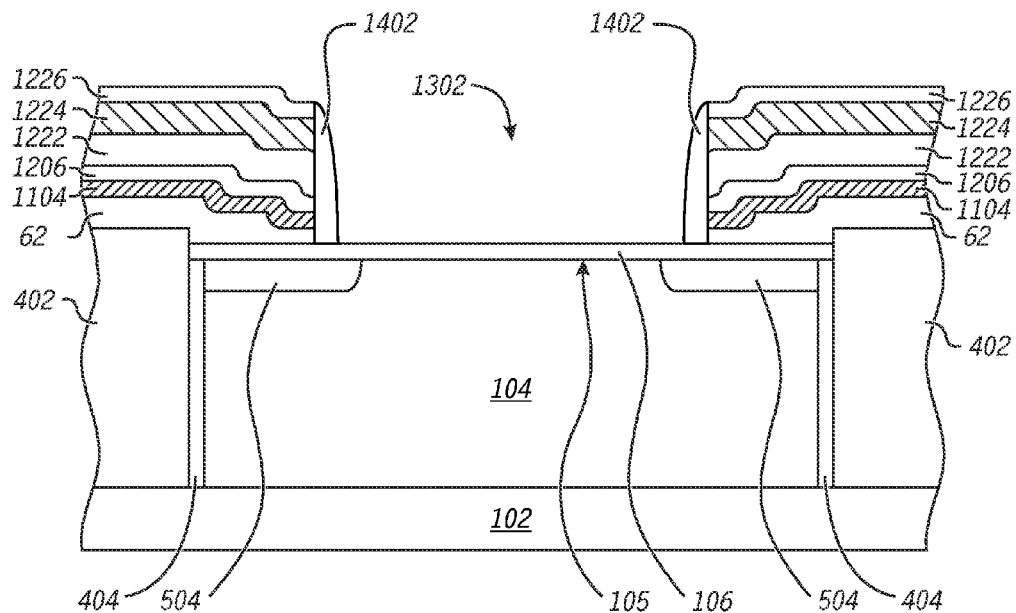
FIG. 14 includes an illustration of a cross-sectional view of the workpiece of FIG. 13 after forming an insulating sidewall spacer.

Openings, such as opening 1302, are formed through the layers 62, 1104, 1206, 1222, 1224, and 1226, as illustrated in FIG. 13. The openings are formed such that portions of the surface doped region 504 underlie the opening 1302. Such portions allow part of the surface doped region 504 to underlie part of a subsequently-formed gate electrode. Insulating sidewall spacers, such as insulating sidewall spacer 1402, are formed along sides of the openings, such as opening 1302 in FIG. 14. The insulating sidewall spacers electrically insulate the conductive layer 1104 from a subsequently-formed gate electrode. The insulating sidewall spacer 1402 can include an oxide, a nitride, an oxynitride, or any combination thereof, and has a width at the base of the insulating sidewall spacer 1402 in a range of approximately 50 nm to approximately 200 nm.

Figure 15:
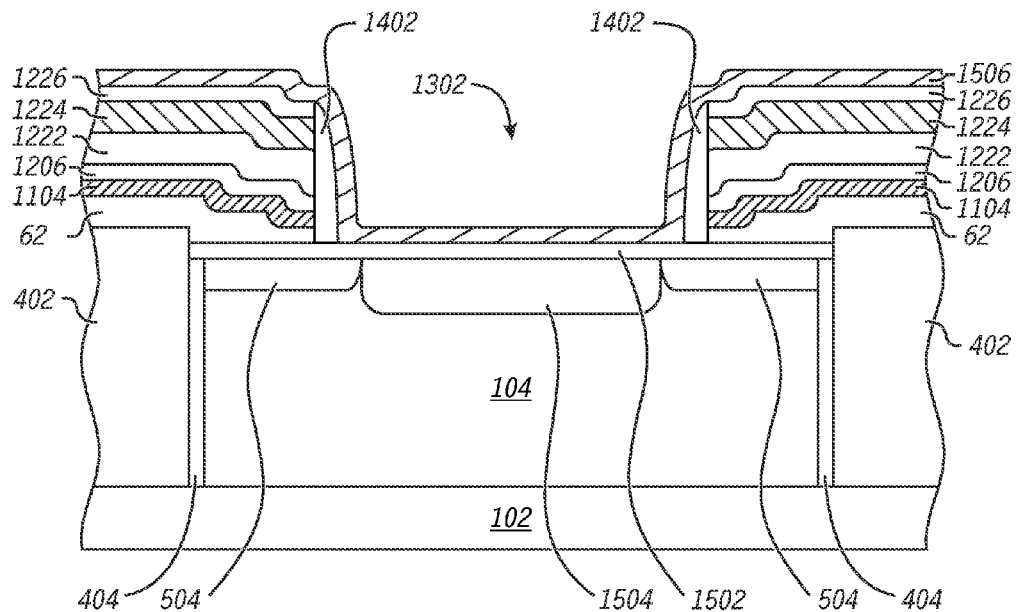
FIG. 15 includes an illustration of a cross-sectional view of the workpiece of FIG. 14 after forming a conductive layer over the exposed surface of the workpiece, and forming a well region within the semiconductor layer.

FIG. 15 includes an illustration of the workpiece after forming a gate dielectric layer 1502, a conductive layer 1506, and a well region 1504. The pad layer 106 is removed by etching and the gate dielectric layer 1502 is formed over the semiconductor layer 104. In a particular embodiment, the gate dielectric layer 1502 includes an oxide, a nitride, an oxynitride, or any combination thereof and has a thickness in a range of approximately 5 nm to approximately 100 nm, and the conductive layer 1506 overlie the gate dielectric layer 1502. The conductive layer 1506 can be part of subsequently-formed gate electrodes. The conductive layer 1506 can be conductive as deposited or can be deposited as a highly resistive layer (e.g., undoped polysilicon) and subsequently made conductive. The conductive layer 1506 can include a metal-containing or semiconductor-containing material. The thickness of the conductive layer 1506 is selected such that, from a top view, a substantially vertical edge of the conductive layer 1506 exposed within the opening 1302 is near the edge of the surface doped region 504. In an embodiment, the conductive layer 1506 is deposited to a thickness of about 0.1 microns to about 0.15 microns.

After the conductive layer 1506 is formed, the semiconductor layer 104 can be doped to form well regions, such as well region 1504 in FIG. 15. The conductivity type of the well region 1504 is opposite that of the surface doped region 504 and underlying doped region 102. In an embodiment, boron dopant is introduced through opening 1302, the conductive layer 1506, and the gate dielectric layer 1502 into semiconductor layer 104 to provide p-type dopant for the well region 1504. In one embodiment, the well region 1504 has a depth greater than a depth of a subsequently-formed source region, and in another embodiment, the well region 1504 has a depth of at least approximately 0.5 microns. In a further embodiment, the well region 1504 has a depth no greater than approximately 2.0 microns, and in still another embodiment, no greater than approximately 1.5 microns. By way of example, the well region 1504 can be formed using two or more ion implantations. In a particular example, each ion implantation is performed using a dose of approximately $1.0 \times 10^{13}$ atoms/cm$^2$, and the two implants having energies of about 25 KeV and 50 KeV. In another embodiment, more or fewer ion implantations may be performed in forming the well regions. Different doses may be used at the different energies, higher or lighter doses, higher or lower energies, or any combination thereof may be used to meet the needs or desires for a particular application.

Figure 16:
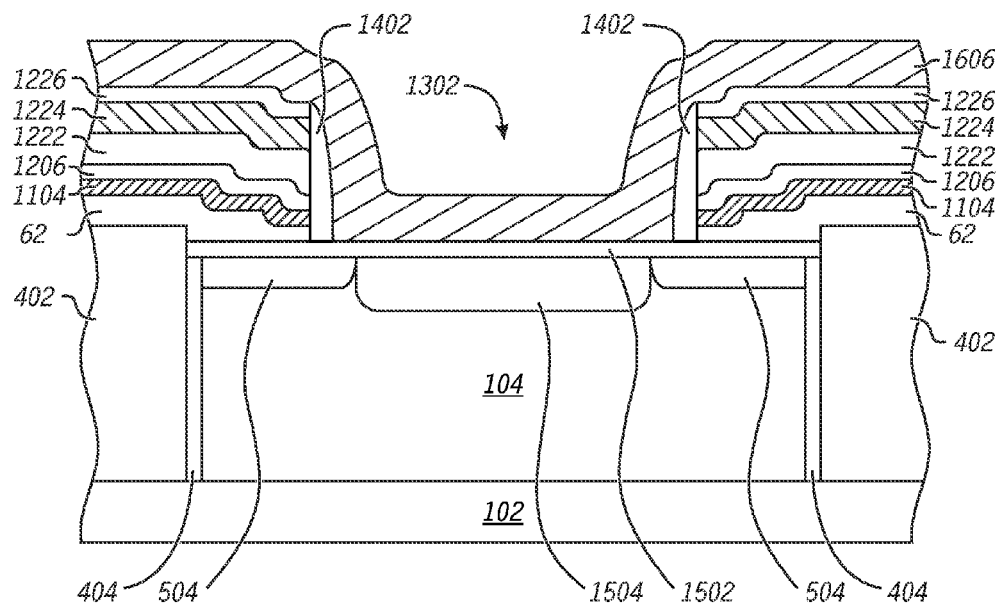
FIG. 16 includes an illustration of a cross-sectional view of the workpiece of FIG. 15 after forming a remaining portion of the conductive layer over the exposed surface of the workpiece.

Additional conductive material is deposited on the conductive layer 1506 to form the conductive layer 1606, as illustrated in FIG. 16. Gate electrodes will be formed from the conductive layer 1606, and therefore, the conductive layer is a gate electrode layer in the illustrated embodiment. The conductive layer 1606 can include any of the materials previously described with respect to the conductive layer 1506. Similar to the conductive layer 1506, the additional conductive material can be conductive as deposited or can be deposited as a highly resistive layer (e.g., undoped polysilicon) and subsequently made conductive. As between the conductive layer 1506 and the additional conductive material, they can have the same composition or different compositions. The thickness of the conductive layer 1606, including the conductive layer 1506 and the additional conductive material, has a thickness in a range of approximately 0.2 microns to approximately 0.5 microns. In a particular embodiment, the additional conductive material includes polysilicon and can be doped with an n-type dopant during deposition or doped subsequently using ion implantation or another doping technique.

Figure 17:
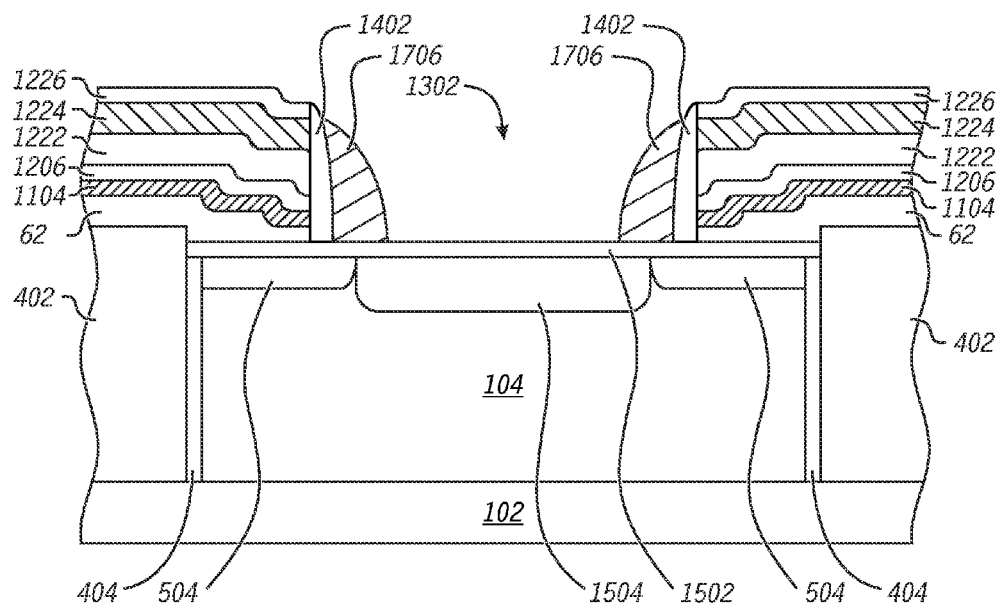
FIG. 17 includes an illustration of a cross-sectional view of the workpiece of FIG. 16 after forming a gate electrode.

The conductive layer 1606 is anisotropically etched to form gate electrodes, such as gate electrode 1706 in FIG. 17. In the illustrated embodiment, the gate electrode 1706 is formed without using a mask and has a shape of a sidewall spacer. The etch to perform the gate electrode 1706 can be performed such that the insulating layer 1226 and gate dielectric layer 1502 are exposed. The etch can be extended to expose a portion of the insulating sidewall spacer 1402. An insulating layer (not illustrated) may be thermally grown from the gate electrode 1706 or may be deposited over the workpiece. The thickness of the insulating layer can be in a range of approximately 10 nm to approximately 30 nm.

Figure 18:
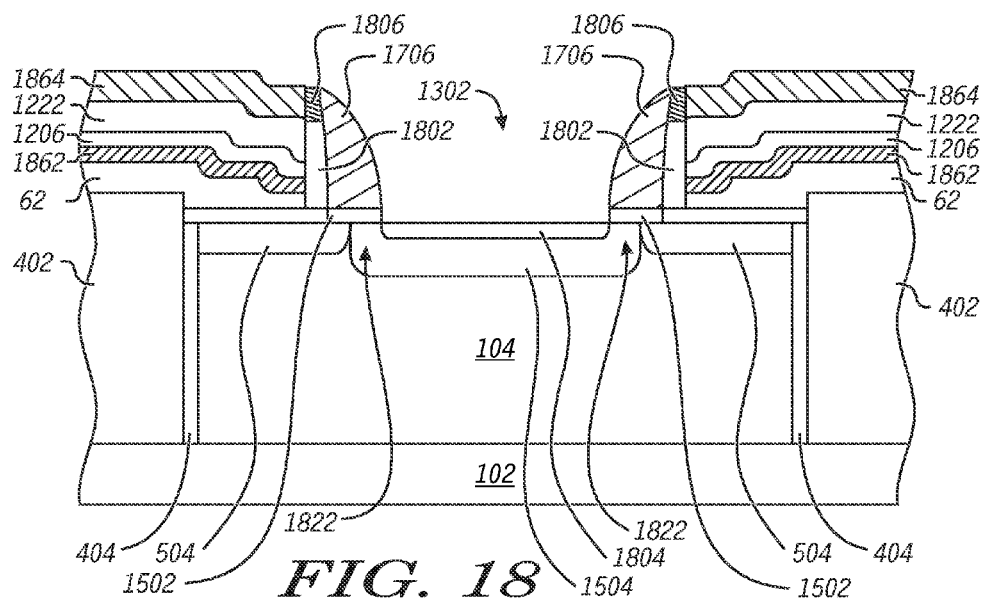
FIG. 18 includes an illustration of a cross-sectional view of the workpiece of FIG. 17 after removing an uppermost insulating layer, truncating the insulating sidewall spacer, and filling a gap between the gate electrode and the conductive layer with a conductive fill material.

FIG. 18 includes an illustration of the workpiece after forming a conductive electrode 1862, a gate signal line 1864, a truncated insulating sidewall spacer 1802, a source region 1804, and a conductive fill material 1806 between the gate signal line 1864 and the gate electrode 1706. Although the operations carried out to form the workpiece are described in a particular order, after reading this specification, skilled artisans will appreciate that the order can be changed as needed or desired. In addition, a mask or a plurality of masks (not illustrated) may be used to achieve the workpiece in the embodiment illustrated in FIG. 18.

If the conductive layers 1104 and 1224 have not yet been patterned, they are patterned to form conductive electrodes and gate signal lines, such as conductive electrode 1862 and gate signal line 1864. The conductive electrode 1862 can be used to help reduce capacitive coupling between the conductive structure 402 and any one or more of the gate signal line 1864, the gate electrode 1706, or both the gate signal line 1864 and the gate electrode 1706. The gate signal line 1864 can be used to provide signals from control electronics (not illustrated) to the gate electrode 1706.

Source regions, such as source region 1804, can be formed using ion implantation. The source region 1804 is heavily doped and has an opposite conductivity type as compared to the well region 1504 and the same conductivity type as the surface doped region 504 and the underlying doped region 102. The portion of the well region 1504 lying between the source region 1804 and the surface doped region 504 and underlying the gate electrode 1706 is a channel region 1822 for the power transistor being formed.

The insulating sidewall spacer 1402 can be truncated to form the truncated insulating sidewall spacer 1802 by etching an upper portion of the sidewall spacer 1402 to remove part of the insulating sidewall spacer 1402 from between the conductive layer 1224 (gate signal layer) and the gate electrode 1706. The amount of the insulating sidewall spacer 1402 that is removed is at least enough to allow the conductive fill material 1806, when formed, to electrically connect the conductive layer 1224 and the gate electrode 1706 but not etching so much of the insulating sidewall spacers 1402 to expose the conductive layer 1104 (the conductive electrode layer), as the gate electrode 1706 and conductive layer 1224 would be electrically connected to the conductive layer 1104, which is undesired. In the embodiment as illustrated, the etching is performed such that an uppermost surface of the truncated insulating sidewall spacer 1802 lies at about the interface between the insulating layer 1222 and the conductive layer 1224.

The conductive fill material 1806 is formed above the truncated insulating sidewall spacer 1802 to electrically connect the gate electrode 1706 to the conductive layer 1224. The conductive fill material 1806 may be selectively grown or deposited over substantially all of the workpiece and subsequently removed from regions outside the gap between the gate electrode 1706 and the gate signal line 1864. Exposed portions of the insulating layer 1226 and gate dielectric layer 1502 are removed, if needed or desired.

Figure 19:
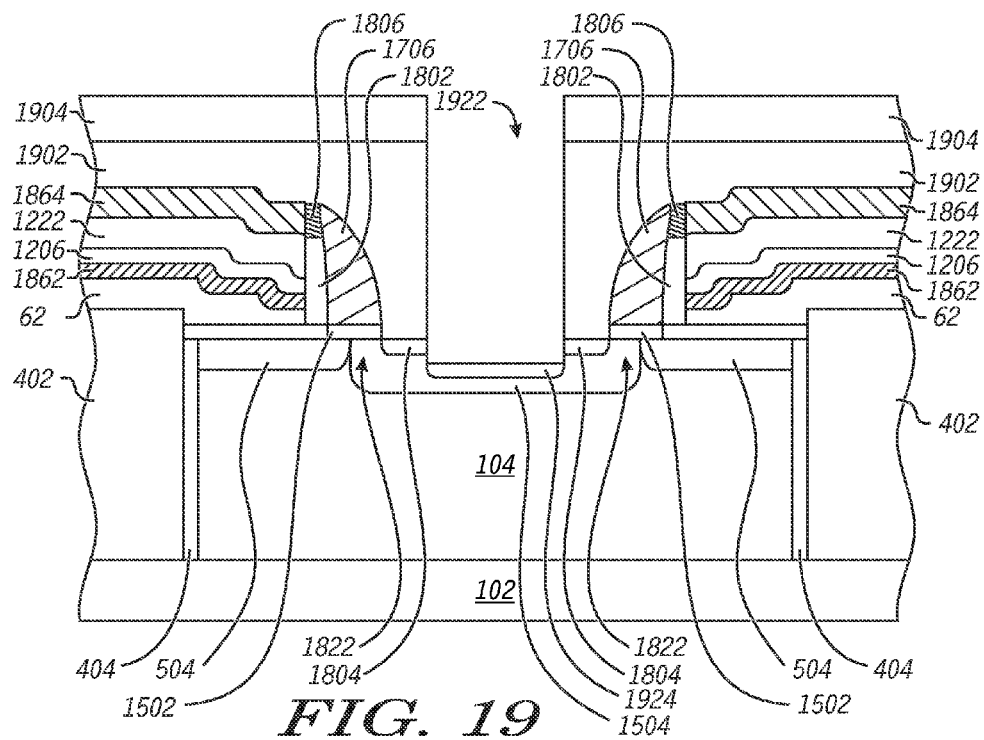
FIG. 19 includes an illustration of a cross-sectional view of the workpiece of FIG. 18 after forming an opening through interlevel dielectric layer and the source region, and after forming a well contact region.

FIG. 19 includes an illustration of the workpiece after an interlevel dielectric (ILD) layer 1902 has been formed and patterned to define contact openings, and after doping to form well contact regions. The ILD layer 1902 can include an oxide, a nitride, an oxynitride, or any combination thereof. The ILD layer 1902 can include a single film having a substantially constant or changing composition (e.g., a high phosphorus content further from the semiconductor layer 104) or a plurality of discrete films. An etch-stop film, an antireflective film, or a combination may be used within or over the ILD layer 1902 to help with processing. The ILD layer 1902 may be planarized to improve process margin during subsequent processing operations (e.g., lithography, subsequent polishing, or the like). A resist layer 1904 is formed over the ILD layer 1902 and is patterned to define resist layer openings. An anisotropic etch is performed to define contact openings, such as the contact opening 1922, that extend through the ILD layer 1902. Unlike many conventional contact etch operations, the etch is continued to extend through the source region 1804 and ends within the well region 1504. The etch can be performed as a timed etch or as an endpoint detected etch with a timed overetch. The first endpoint may be detected when the source region 1804 becomes exposed, and a second endpoint may be detected by the presence of boron within the well region 1504 in a particular embodiment. Well contact regions, such as the well contact region 1924, are formed by doping the bottom part of the contact openings, such as the contact opening 1922. The well contact region 1924 may be implanted with a dopant having the same conductivity type as the well region 1504 in which it resides. The well contact region 1924 is heavily doped so that an ohmic contact can be subsequently formed. While the resist layer 1904 is in place, an isotropic etch can be performed to expose uppermost surfaces of the source regions, such as the source region 1804, as will become more apparent with the description with respect to FIG. 20. At this point in the process, the power transistors, such as the power transistor as illustrated in FIG. 19, are formed.

Figure 20:
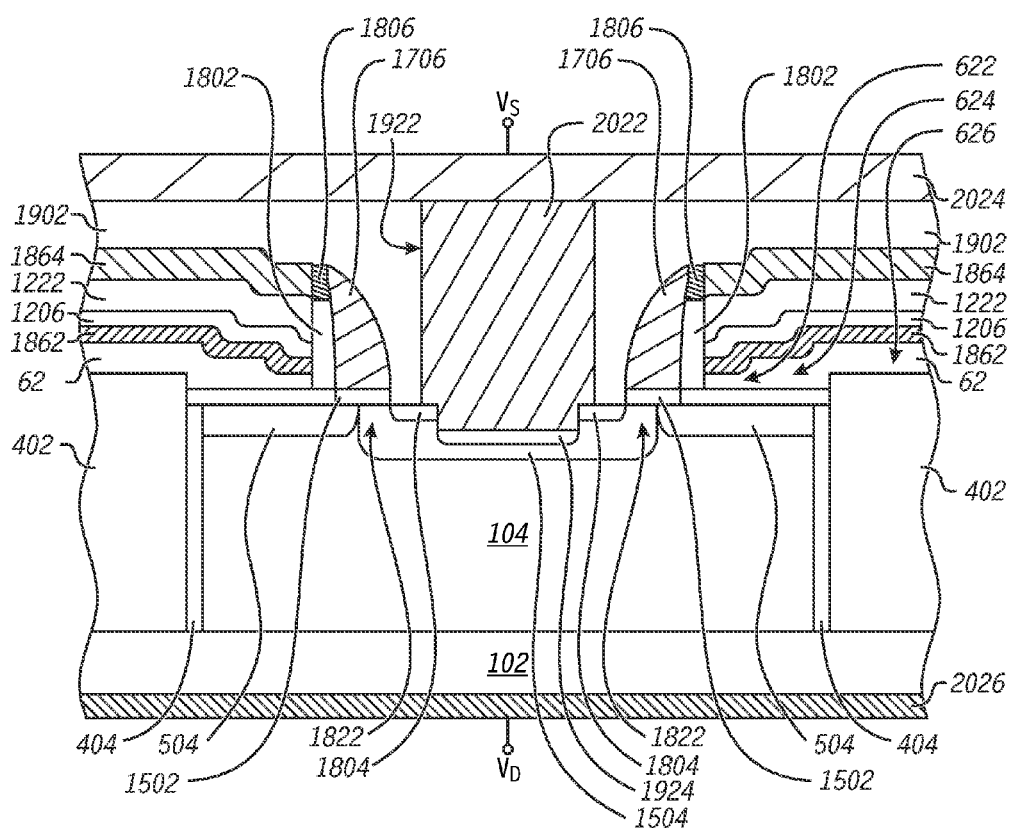
FIG. 20 includes an illustration of a cross-sectional view of the workpiece of FIG. 19 after forming a substantially completed electronic device in accordance with an embodiment of the present invention.

FIG. 20 includes an illustration of a substantially completed electronic device that includes conductive plugs and terminals. More particularly, a conductive layer is formed along the exposed surface of the workpiece and within the contact openings, including the contact opening 1922. The conductive layer can include a single film or a plurality of films. In an embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. The selection of the number of films and composition(s) of those film(s) depend on electrical performance, the temperature of a subsequent heat cycle, another criterion, or any combination thereof. After reading this specification, skilled artisans will be able to determine the composition of the conductive layer to meet their needs or desires for a particular application. The portion of the conductive layer that overlies the ILD layer 1902 is removed to form conductive plugs, such as the conductive plug 2022 within the contact opening 1922.

Conductive layers can be deposited to form a source terminal 2024 and a drain terminal 2026. The conductive layers may each include a single film or a plurality of discrete films. Exemplary materials include aluminum, tungsten, copper, gold, or the like. Each conductive layer may or may not be patterned to form the source terminal 2024, or the drain terminal 2026, as illustrated in FIG. 20. In a particular embodiment, the drain terminal 2026 may be part of a backside contact to the substrate that includes the underlying doped region 102. In another embodiment, the conductive layer that is used to form the source terminal 2024 may be patterned to also form a gate terminal (not illustrated) that would be coupled to the gate signal line 1864. In the embodiment as illustrated, no conductive plugs extend to the vertically-oriented conductive regions, and particularly to the conductive structure 402.

The electronic device can include many other power transistors that are substantially identical to the power transistor as illustrated in FIG. 20. The power transistors are connected in parallel to give a sufficient effective channel width of the electronic device that can support the relatively high current flow that is used during normal operation of the electronic device.

The conductive electrode 1862 can be used to shield the gate electrode 1706 from the electrical field generated by the conductive structure 402 when the electronic device is operating. Thus, the conductive electrode 1862 helps to reduce capacitive coupling between the conductive structure 402 and each of the gate electrode 1706 and the gate signal line 1864. Such shielding can allow the transistor to operate at a higher switching speed.

The electronic device may be designed to have a maximum source-to-drain voltage difference of 20 V or higher, such as 30 V or 50 V. The voltage of the conductive structure 402 can be substantially the same as $V_D$, and thus, a relatively high voltage difference can be present between the conductive structure 402 and the conductive electrode 1862. In a particular embodiment, the electronic device may have a normal operating state where the conductive electrode 1862 is at approximately $V_S$ or approximately 0 volts, and the conductive structure 402 is at approximately $V_D$ or approximately 30 V. If the insulating layer 62 were designed to be substantially the same thickness when present in a finished form of the electronic device, undesired effects may occur. If the insulating layer 62 would be relatively and uniformly thin, the thinner thickness helps to shield the gate electrode 1706 and improve switching speed; however, the relatively thin insulating layer 62 may be incapable of withstanding the electrical field between the conductive structure 402 and the conductive electrode 1862. Additional benefits of a relatively thin insulating layer 62 include better depletion of surface doped region 504 under normal reverse bias operating conditions, and a corresponding reduction in the electrical potential near the junction between surface doped region 504 and the channel region 1822, enabling a shorter effective channel length to be controlled without undesirable electrical punch-through creating high leakage currents. If the insulating layer 62 would be relatively and uniformly thick, the thicker thickness helps to withstand the electrical field between the conductive structure 402 and the conductive electrode 1862; however, the relatively thick insulating layer 62 is detrimental to shielding the gate electrode 1706 and switching speed. A further benefit to having conduction electrode 1862 overlying an insulating layer 62 that is thinner in region 622 and thicker in region 626 is that it can be used to shift the position of avalanche current generation away from channel 1822 towards the vertical conductive structure 402. By moving this source of hot carriers away from the channel region of the transistor, device robustness and reliability can be improved.

By having different thicknesses of the insulating layer 62 between the regions 622 and 626, better shielding of a thinner insulating layer can be achieved while still allowing an acceptable dielectric breakdown voltage with respect to the insulating layer between the conductive structure 402 and the conductive electrode 1862. When fully depleted under normal reverse bias operating conditions, the depletion charge in surface doped region 504 allows the voltage within the surface doped region 504 to decrease from a higher voltage at a location closer to the conductive structure 402 to a lower voltage at another location closer to a channel region 1822, which lies between the surface doped region 504 and the source region 1804. The lower voltage does not need as thick of an insulating layer to protect against dielectric breakdown. Thus, the insulating layer 62 within the region 622 can be thinner, and the insulating layer 62 within the region 626 can be thicker. The insulating layer 62 within the region 624 may be the same thickness as the insulating layer within regions 622 and 626 or may have a thickness between the insulating layer 62 within the regions 622 and 624.

Other embodiments can be used if needed or desired. In another embodiment (not illustrated), a compensation region may be used to help lower $R_{DSON}$. The compensation region would be located adjacent to the surface doped region 504. During normal operating conditions, the surface doped region 504 can be simultaneously depleted from above by the conductive electrode 1862 and from below by the compensating region. This can allow the peak dopant concentration in the surface doped region 504 to be increased and result in a lower $R_{DSON}$ for the same breakdown voltage ($BV_{DSS}$) rating. The compensation region has a conductivity type opposite that of the surface doped region 504 and the underlying doped region 102. The compensation region has a dopant concentration no greater than approximately $2 \times 10^{17}$ atoms/cm$^3$ in a particular embodiment, or no greater than approximately $5 \times 10^{16}$ atoms/cm$^3$ in another particular embodiment.

The transistor as illustrated and described herein can be an NMOS transistor, in which the source region 1804, surface doped region 504, sidewall doped region 404, and underlying doped region 102 are n-type doped, and the channel region 1822 is p-type doped. In another embodiment, the transistor can be a PMOS transistor by reversing the conductivity types of the previously described regions.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a semiconductor layer having a primary surface, a channel region, a conductive electrode; and an insulating layer. The insulating layer can lie between the primary surface and the conductive electrode, wherein the insulating layer has a first region and a second region, the first region is thinner than the second region, and the channel region lies closer to the first region than the second region.

In an embodiment of the first aspect, the second region includes at least one more film as compared to the first region. In another embodiment, the electronic device further includes a source region lying adjacent to the channel region; a conductive structure lying within a trench in the semiconductor layer; and a surface doped region spaced apart from the underlying doped region. The channel region lies closer to the surface doped region than the conductive structure, the first region of the insulating layer overlies the surface doped region; and the second region of the insulating layer overlies the conductive structure. In a particular embodiment, the electronic device further includes a drain and is designed to normally operate at a source-to-drain voltage difference of at least approximately 20 volts. In another particular embodiment, the source and conductive structure are designed to normally operate at a source-to-conductive structure voltage difference of at least approximately 20 volts. In still another particular embodiment, the surface doped region extends approximately 0.2 micron to approximately 3.0 microns along the primary surface of the semiconductor layer from the conductive structure toward the source region.

In a second aspect, an electronic device can include a semiconductor layer having a primary surface and a trench therein extending from the primary surface, a conductive structure within the trench, and a gate electrode overlying the semiconductor layer. The electronic device can also include an insulating layer including a first region and a second region, wherein the second region is thicker than the first region, the gate electrode lies closer to the first region than the second region, and the second region overlies the conductive structure. The electronic device can further include a conductive electrode overlying the first and second regions of the insulating layer and the conductive structure.

In an embodiment of the second aspect, the electronic device further includes a gate signal line overlying the primary surface of the semiconductor layer and the conductive electrode, wherein the gate electrode does not overlie the conductive electrode, and the conductive electrode is configured to be at a substantially constant voltage when the electronic device is in a normal operating state. In a particular embodiment, a portion of the conductive electrode lies adjacent to the gate electrode and has a first surface and a second surface opposite the first surface, the primary surface is closer to the first surface than the second surface, and within an area occupied by the transistor, each of the first and second surfaces of the conductive electrode lies at elevations between lowermost and uppermost points of the gate electrode.

In another embodiment of the second aspect, the electronic device further includes a source region lying adjacent to the gate electrode, a channel region lying adjacent to the source region and the gate electrode, a conductive structure lying within a trench in the semiconductor layer, an underlying doped region that underlies the semiconductor layer and the conductive structure, and a surface doped region spaced apart from the underlying doped region. In this embodiment, the channel region lies closer to the surface doped region as compared to the conductive structure, the first region of the insulating layer overlies the surface doped region, and the second region of the insulating layer overlies the conductive structure. In a particular embodiment, the electronic device further includes a drain, wherein the electronic device includes a transistor that includes the source, gate electrode, and drain, and the transistor is designed to normally operate at a source-to-drain voltage difference of at least approximately 20 volts. In another particular embodiment, the electronic device includes a transistor that includes the source and gate electrode, and the transistor is designed to normally operate at a source-to-conductive structure voltage difference of at least approximately 20 volts. In still another particular embodiment, the surface doped region extends approximately 0.2 micron to approximately 3.0 microns along the primary surface from the conductive structure toward the source region.

In a third aspect, a process of forming an electronic device can include providing a workpiece including a substrate, including an underlying doped region, and a semiconductor layer overlying the underlying doped region, wherein the semiconductor layer has a primary surface spaced apart from the underlying doped region. The process can also include forming an insulating layer over the semiconductor layer, wherein the insulating layer has a first region and a second region, and the first region is thinner than the second region, forming a conductive electrode over the first and second regions of the insulating layer, and forming a source region that lies closer to the first region of the insulating layer compared to the second region of the insulating layer.

In an embodiment of the third aspect, forming the insulating layer includes depositing the insulating layer, forming a mask that defines and opening overlying the first region of the insulating layer, and isotropically etching the insulating layer within the first region. In another embodiment, forming the insulating layer includes depositing an insulating layer, patterning the insulating layer to define an opening overlying the first region of the insulating layer, and forming an insulating sidewall spacer within the opening. In a still another embodiment, forming the insulating layer includes depositing the insulating layer, forming a mask that defines an opening overlying the first region of the insulating layer, and simultaneously etching exposed portions of the insulating layer and the mask during at least one point time, such that from a cross-sectional view, the insulating layer has a substantially linear slope after simultaneously etching. In yet another embodiment, forming an insulating layer includes depositing the insulating layer, forming a mask that defines an opening overlying the first region of the insulating layer, anisotropically etching the insulating layer underlying the opening to etch through a part of a thickness of the insulating layer, isotropically etching a portion of the mask to widen the opening in the mask after anisotropically etching the insulating layer, and anisotropically etching the insulating layer underlying the widened opening after isotropically etching the portion of the mask.

In a further embodiment of the third aspect, the process further includes forming a trench within the semiconductor layer, wherein the trench extends from the primary surface toward the underlying doped region, forming a conductive structure lying within the trench, and forming a surface doped region spaced apart from the underlying doped region, wherein the first region of the insulating layer overlies the surface doped region, and the second region of the insulating layer overlies the conductive structure. In a particular embodiment, the transistor is designed to normally operate at a source-to-conductive structure voltage difference of at least approximately 20 volts. In a more particular embodiment, the surface doped region extends approximately 0.2 micron to approximately 3.0 microns along the primary surface from the conductive structure toward the source region. In another particular embodiment, the process further includes forming a gate signal line over the conductive electrode, and forming a gate electrode over the primary surface of the semiconductor layer, wherein the gate electrode does not overlie the conductive electrode. In this embodiment, the conductive electrode lies between the gate signal line and each of the conductive structure and the surface doped region, and in a finished form of the electronic device, the conductive electrode is configured to be at a substantially constant voltage when the electronic device is in a normal operating state. In a more particular embodiment, the transistor is designed to normally operate at a source-to-drain voltage difference of at least approximately 20 volts.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a channel region within a semiconductor layer;
   a source region;
   a surface doped region adjacent to the channel region;
   a conductive electrode spaced apart from the source region;
   an insulating layer lying between the surface doped region and the conductive electrode, wherein:
      the insulating layer has a first thickness at a first location and a second thickness at a second location;
      the conductive electrode directly overlies the first and second locations of the insulating layer; and
      the first thickness is different from the second thickness; and
   a gate electrode overlying the channel region, wherein each of the first and second locations is laterally spaced apart from the gate electrode.

2. The electronic device of claim 1, wherein the insulating layer directly contacts the surface doped region and the conductive electrode along opposite sides of the insulating layer.

3. The electronic device of claim 1, wherein the first thickness is no greater than approximately 0.2 microns.

4. The electronic device of claim 1, wherein an uppermost part of the gate electrode lies at a higher elevation than an uppermost part of the conductive electrode.

5. The electronic device of claim 1, further comprising a trench having a substantially vertical sidewall, wherein the surface doped region is adjacent to the substantially vertical sidewall, and each of the first and second locations is laterally spaced apart from the substantially vertical sidewall.

6. The electronic device of claim 1, wherein the first thickness is thinner than the second thickness.

7. The electronic device of claim 1, wherein the second region comprises at least one more film as compared to the first region.

8. The electronic device of claim 1, further comprising a substrate underlying the semiconductor layer, wherein an underlying doped region lies within the substrate and is electrically connected to the surface doped region.

9. The electronic device of claim 8, wherein the surface doped region has a depth of approximately 0.1 micron to approximately 0.5 microns.

10. The electronic device of claim 1, further comprising a gate signal line that overlies the conductive electrode.

11. An electronic device comprising:
    a semiconductor layer having a trench with a substantially vertical sidewall;
    a surface doped region adjacent to the substantially vertical sidewall;
    a conductive electrode; and
    an insulating layer lying between the surface doped region and the conductive electrode, wherein:
       the insulating layer has a first region, a second region, and a third region, the second region disposed between the first and third regions, and the third region is closest to the substantially vertical sidewall as compared to the first and second regions; and
       the first, second, and third regions have different thicknesses as compared to one another.

12. The electronic device of claim 11, wherein the first region is thinner than each of the second and third regions.

13. The electronic device of claim 12, wherein the third region is thicker than each of the first and second regions.

14. The electronic device of claim 11, wherein the conductive electrode overlies the first, second, and third regions.

15. The electronic device of claim 11, further comprising a gate electrode and a gate signal line overlying the conductive electrode, wherein:
    the gate electrode does not overlie the conductive electrode; and
    the conductive electrode is configured to be at a substantially constant voltage when the electronic device is in a normal operating state.

16. The electronic device of claim 11, further comprising a source region and an interconnect electrically coupled to the source region, wherein the interconnect overlies and is spaced apart from the conductive electrode.

17. A process of forming an electronic device comprising:
    providing a workpiece comprising a substrate, including an underlying doped region, and a semiconductor layer, including a surface region, overlying the underlying doped region;
    forming an insulating layer over the semiconductor layer, wherein the insulating layer has a first region and a second region, and the first region has a different thickness as compared to the second region;
    forming a conductive electrode over the first and second regions of the insulating layer; and forming a gate electrode after forming the conductive electrode.

18. The process of claim 17, further comprising forming a gate dielectric layer after forming the insulating layer including the first and second regions.

19. The process of claim 17, wherein the gate electrode is spaced apart from the first and second regions of the insulating layer.

* * * * *